(12) United States Patent
Huang et al.

(10) Patent No.: US 11,289,594 B2
(45) Date of Patent: Mar. 29, 2022

(54) GAN-BASED SUPERJUNCTION VERTICAL POWER TRANSISTOR AND MANUFACTURING METHOD THEREOF

(71) Applicant: INSTITUTE OF MICROELECTRONICS, CHINESE ACADEMY OF SCIENCES, Beijing (CN)

(72) Inventors: Sen Huang, Beijing (CN); Xinhua Wang, Beijing (CN); Xinyu Liu, Beijing (CN); Yuankun Wang, Beijing (CN); Haibo Yin, Beijing (CN); Ke Wei, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/635,323

(22) PCT Filed: Mar. 14, 2019

(86) PCT No.: PCT/CN2019/078113
§ 371 (c)(1),
(2) Date: Jan. 30, 2020

(87) PCT Pub. No.: WO2020/181548
PCT Pub. Date: Sep. 17, 2020

(65) Prior Publication Data
US 2021/0399125 A1    Dec. 23, 2021

(51) Int. Cl.
*H01L 29/778* (2006.01)
*H01L 29/06* (2006.01)
(Continued)

(52) U.S. Cl.
CPC ...... *H01L 29/7788* (2013.01); *H01L 29/0634* (2013.01); *H01L 29/2003* (2013.01);
(Continued)

(58) Field of Classification Search
None
See application file for complete search history.

(56) References Cited

U.S. PATENT DOCUMENTS

| 8,815,688 B2 | 8/2014 | Lee et al. |
| 2006/0071295 A1 | 4/2006 | Chang |

(Continued)

FOREIGN PATENT DOCUMENTS

| CN | 102612750 A | 7/2012 |
| CN | 102915928 | 2/2013 |

(Continued)

OTHER PUBLICATIONS

Udrea, F. "Superjunction Power Devices, History, Development, and Future Prospects" IEEE Trans. on Elec. Dev. vol. 64, No. 3, Mar. 2017 pp. 713-727 (Year: 2017).*

(Continued)

*Primary Examiner* — Grant S Withers
(74) *Attorney, Agent, or Firm* — Pillsbury Withrop Shaw Pittman LLP

(57) ABSTRACT

A GaN-based superjunction vertical power transistor and a manufacturing method thereof. The transistor includes: a $N^-$-GaN layer; a first P-GaN layer as a current blocking layer, formed on the $N^-$-GaN layer and having a gate region window; and a thin barrier Al(In, Ga)N/GaN heterostructure conformally formed on the current blocking layer and filling the bottom and one or more sidewalls of the gate region window, wherein the $N^-$-GaN layer has an etched groove completely or partially filled with a second P-type GaN layer, an $N^+$-GaN layer is formed under the second P-type
(Continued)

GaN layer, and the $N^+$-GaN layer is in direct contact with the second P-type GaN layer and the $N^-$-GaN layer to form a superjunction composite structure.

17 Claims, 10 Drawing Sheets

(51) Int. Cl.
    *H01L 29/20*     (2006.01)
    *H01L 29/205*     (2006.01)
    *H01L 29/66*     (2006.01)

(52) U.S. Cl.
    CPC ...... *H01L 29/205* (2013.01); *H01L 29/66462* (2013.01); *H01L 29/7786* (2013.01); *H01L 29/7787* (2013.01)

(56) References Cited

U.S. PATENT DOCUMENTS

| | | |
|---|---|---|
| 2008/0079009 A1 | 4/2008 | Yaegashi |
| 2013/0034939 A1 | 2/2013 | Lee et al. |
| 2016/0233329 A1* | 8/2016 | Cheng ............... H01L 29/66462 |
| 2018/0076287 A1* | 3/2018 | Ohguro ............... H01L 29/1083 |
| 2019/0115448 A1* | 4/2019 | Chowdhury ........ H01L 21/0262 |
| 2019/0371885 A1* | 12/2019 | Mori ....................... H01L 24/48 |

FOREIGN PATENT DOCUMENTS

| | | |
|---|---|---|
| CN | 106783945 | 5/2017 |
| CN | 106941117 | 7/2017 |
| CN | 107068739 A | 8/2017 |

OTHER PUBLICATIONS

Xiao, M. "Design and Simulation of GaN Superjunction Transistors With 2-DEG Channels and Fin Channels" IEEE Journ. of Emerging and Selected Topics in Power Electronics, vol. 7, No. 3, Sep. 2019 pp. 1475-1484 (Year: 2019).*

Moens, P. "UltiMOS : A Local Charge-Balanced Trench-Based 600V Super-Junction Device" Proceedings of the 23rd International Symposium on Power Semiconductor Devices & IC's May 2011 pp. 304-307 (Year: 2011).*

Chinese Office Action issued in corresponding Chinese Patent Application No. 201910195984.6, dated Sep. 18, 2021.

International Search Report and the Written Opinion of the International Searching Authority as issued in International Patent Application No. PCT/CN2019/078113, dated Jun. 25, 2019.

* cited by examiner

GAN-BASED SUPERJUNCTION VERTICAL POWER TRANSISTOR AND MANUFACTURING METHOD THEREOF

This application is the U.S. national phase entry of PCT Patent Application No. PCT/CN2019/078113, filed on Mar. 14, 2019.

TECHNICAL FIELD

The present disclosure belongs to the technical field of semiconductor high-power devices, and relates to a GaN-based superjunction vertical power transistor and a manufacturing method thereof.

BACKGROUND

The process of GaN-based lateral structure power transistors has become increasingly mature, capable of large size, low cost, and good CMOS compatibility. However, it is difficult to obtain high output current, and is inevitably subject to high voltage current collapse, etc. caused by surface states.

A voltage withstanding layer of a conventional GaN-based vertical structure power transistor is composed of a P-GaN Current Blocking Layer (CBL) and a single N-type lightly doped layer, and has a limited breakdown voltage, and is also bound to sacrifice the performance of the device due to a trade-off between a breakdown voltage and an on-resistance, in order to achieve an optimal value.

SUMMARY

(1) Technical Problem to be Solved

The present disclosure provides a GaN-based superjunction vertical power transistor and a manufacturing method thereof to at least partially solve the above-mentioned technical problems.

(2) Technical Solution

According to an aspect of the present disclosure, there is provided a GaN-based superjunction vertical power transistor, comprising: an N⁻-GaN layer 2; a P-GaN layer 3 as a current blocking layer, formed on the N⁻-GaN layer 2 and having a gate region window therein; and a thin barrier Al(In, Ga)N/GaN heterostructure, conformally formed on the current blocking layer and filling the bottom and sidewalls of the gate region window, wherein the N⁻-GaN layer 2 has an etched groove 102 in which a second P-type GaN layer 9 is completely or partially filled, an N⁺-GaN layer 10 is formed under the second P-type GaN layer 9, and the N⁺-GaN layer 10 is in direct contact with the second P-type GaN layer 9 and the N⁻-GaN layer 2 to form a superjunction composite structure.

In some embodiments of the present disclosure, the GaN-based superjunction vertical power transistor further comprises a source, a drain, and a gate.

In some embodiments of the present disclosure, the gate is formed on a portion of the thin barrier Al(In, Ga)N/GaN heterostructure filling the gate region window, the gate including a gate dielectric layer 14 and a gate metal layer 15; a source region window is further formed in the thin barrier Al(In, Ga)N/GaN heterostructure for forming the source, and the bottom and sidewalls of the source region window are filled with a source metal layer 11; and a drain metal layer 12 is further formed under the N⁺-GaN layer 10.

In some embodiments of the present disclosure, the source metal layer 11 is covered with an insulating material, the insulating material has a composite layer structure comprising an isolation layer 13 and the gate dielectric layer 14, and a passivation layer 7 is provided between the isolation layer 13 and the thin barrier Al(In, Ga)N/GaN heterostructure in a region between the gate and the source.

In some embodiments of the present disclosure, two-dimensional electron gas between the gate and the source in the thin barrier Al(In, Ga)N/GaN heterostructure is recovered by passivation of the passivation layer between the gate and the source, or entire passivation of the passivation layer and the isolation layer, and the material of the passivation layer comprises one or more of the following materials: polarized AlN, $SiN_x$ or SiON.

In some embodiments of the present disclosure, an Al(In, Ga)N barrier layer in the thin barrier Al(In, Ga)N/GaN heterostructure is one or more of the following materials: a ternary alloy comprising AlGaN, AlInN or InGaN; or a quaternary alloy comprising AlInGaN; and the Al(In, Ga)N barrier layer has a thickness between 0.5 nm and 5 nm.

In some embodiments of the present disclosure, the second P-type GaN layer 9 has a concentration ranging from $10^{16}$ $cm^{-3}$ to $10^{20}$ $cm^{-3}$.

According to another aspect of the present disclosure, there is provided a method of manufacturing a GaN-based superjunction vertical power transistor, comprising:

Step S21: epitaxially growing an N⁻-GaN layer 2 on a substrate 1;

Step S22: epitaxially growing a P-GaN layer 3 on the N⁻-GaN layer 2, as a current blocking layer;

Step S23: forming a gate region window 101 in the current blocking layer 3 by a gate trench etching technique;

Step S24: conformally growing a thin barrier Al(In, Ga)N/GaN heterostructure on the current blocking layer 3, the heterostructure filling the bottom and sidewalls of the gate region window;

Step S25: forming an etched groove in the N⁻-GaN layer 2;

Step S26: completely or partially filling a second P-type GaN layer 9 in the etching groove; and Step S27: forming an N⁺-GaN layer 10 under the second P-type GaN layer 9, the N⁺-GaN layer 10 being in direct contact with the second P-type GaN layer 9 and the N⁻-GaN layer 2 to form a superjunction composite structure.

In some embodiments of the present disclosure, Step S25 comprises:

depositing a second dielectric layer 7 on an upper surface of the thin barrier Al(In, Ga)N/GaN heterostructure, as a passivation layer, and depositing a third dielectric layer 8 on a lower surface of the N⁻-GaN layer 2 or the GaN substrate; and forming an etched groove by performing selective etching in the N⁻-GaN layer 2 by using the third dielectric layer 8 as a mask layer;

Step S28 after the Step S27 comprises: forming a source, a drain, and a gate, and the Step S28 further comprises:

etching the second dielectric layer and the thin barrier Al(In, Ga)N/GaN heterostructure of the source region to the P-GaN layer by a gate trench etching technique to obtain a source region window 103;

depositing a source metal layer 11 on the sidewalls and the bottom of the source region window 103;

depositing a drain metal layer 12 under the N⁺-GaN layer 10;

growing a passivation protective layer 13 on the source metal layer 11 and the second dielectric layer 7, as an isolation layer 13 for device isolation;

performing isolation using high energy ion injection in an active region of the device;

etching the isolation layer 13 and the second dielectric layer 7 of the gate region to an upper surface of a thin barrier layer Al(In, Ga)N by a gate trench etching technique;

conformally growing a gate dielectric layer 14 on the upper surface of the thin barrier layer Al(In, Ga)N and the upper surface of the isolation layer 13; and growing a gate metal layer 15 on the gate dielectric layer 14.

In some embodiments of the present disclosure, the substrate is one or more of the following planar substrates: a Si substrate, a SiC substrate, a sapphire substrate, or a GaN bulk material substrate; and/or the second dielectric layer and the third dielectric layer are prepared by LPCVD or PECVD, and the materials of the second dielectric layer and the third dielectric layer comprise one or more of the following materials: $SiO_2$, polarized AlN, $SiN_x$ or SiON; and/or the second dielectric layer and the third dielectric layer have a thickness between 10 nm and 120 nm; and/or the etched groove has a depth between a surface of the $N^-$-GaN layer and an interface between the $N^-$-GaN layer and the P-GaN layer, or is etched to the interface between the $N^-$-GaN layer and the P-GaN layer; and/or the material of the gate dielectric layer comprises one or more of the following materials: $Al_2O_3$, $SiO_2$, $SiN_x$ or SiON.

(3) Beneficial Effects

It can be seen from the above technical solutions that the GaN-based superjunction vertical power transistor and the manufacturing method thereof provided in the present disclosure have the following beneficial effects:

1. By providing the superjunction composite structure, the expansion of a superjunction space charge region is realized, a region where the device is subjected to a high electric field is increased, and the peak breakdown electric field of the device is effectively mitigated, thereby increasing the breakdown voltage of the device, while the thin barrier Al(In, Ga)N/GaN heterostructure is used to realize an etch-free enhanced gate structure, promoting an application of the GaN-based vertical structure power transistor with high voltage and high power.

2. The process of forming p-GaN by using epitaxially grown p-GaN instead of a conventional injection method avoids the problem of injection activation.

3. The thin barrier Al(In, Ga)N/GaN heterostructure is used to form an enhanced device, and two-dimensional electron gas (2DEG) between the gate and the source is recovered by a passivation layer of polarized AlN, $SiN_x$ or SiON, avoiding the problems such as gate trench etching and etched thickness control accompanying the gate trench etching technique.

BRIEF DESCRIPTION OF THE DRAWINGS

FIG. 1 is a structural schematic diagram of forming epitaxial layers of $N^-$-GaN and P-type GaN on a substrate.

FIG. 2 is a structural schematic diagram of forming a mask layer on P-type GaN.

FIG. 3 is a structural schematic diagram of forming a gate region opening by patterning an upper surface mask layer.

FIG. 4 is a structural schematic diagram of forming a gate region window by etching the current blocking layer based on the gate region opening in FIG. 3.

FIG. 5 is a structural schematic diagram of removing the upper surface mask layer.

FIG. 6 is a structural schematic diagram of a conformal growth of a thin barrier Al(In, Ga)N/GaN heterostructure on the current blocking layer.

FIG. 7 is a structural schematic diagram of removing the substrate such that the $N^-$-GaN layer is exposed to the surface when the substrate is a non-GaN substrate.

FIG. 8 is a structural schematic diagram of depositing a second dielectric layer as a passivation layer on an upper surface of the thin barrier Al(In, Ga)N/GaN heterostructure, and depositing a third dielectric layer as a mask layer on a lower surface of the $N^-$-GaN layer.

FIG. 9 is a structural schematic diagram of forming an etched groove by performing selective etching in the $N^-$-GaN layer by using the third dielectric layer as a mask layer.

FIG. 10 is a structural schematic diagram of completely or partially filling a second P-type GaN layer in the etched groove.

FIG. 11 is a structural schematic diagram of removing the mask layer under the $N^-$-GaN layer.

FIG. 12 is a structural schematic diagram of manufacturing an $N^+$-GaN layer under the second P-type GaN layer.

FIG. 13 is a structural schematic diagram of manufacturing a source region window by a gate trench etching technique.

FIG. 14 is a structural schematic diagram of depositing a source metal layer on the sidewalls and the bottom of the source region window and depositing a drain metal layer under the $N^+$-GaN layer.

FIG. 15 is a structural schematic diagram of growing a passivation protective layer, as an isolation layer for device isolation, on the source metal layer and the second dielectric layer.

FIG. 16 is a schematic diagram of performing isolation using high energy ion injection in an active region of the device.

FIG. 17 is a structural schematic diagram of etching the isolation layer and the second dielectric layer of the gate region to an upper surface of the thin barrier layer Al(In, Ga)N by a gate trench etching technique.

FIG. 18 is a structural schematic diagram of a conformal growth of a gate dielectric layer on an upper surface of the thin barrier layer Al(In, Ga)N and an upper surface of the isolation layer.

FIG. 19 is a structural schematic diagram of a GaN-based superjunction vertical power transistor obtained after growing a gate metal layer on the gate dielectric layer.

SYMBOL DESCRIPTION

1. Substrate;
2. $N^-$-GaN layer;
3. P type GaN layer/current blocking layer;
4. First dielectric layer/upper surface mask layer $SiO_2$;
5. GaN layer in a thin barrier heterojunction structure;
6. Al(In, Ga)N layer in a thin barrier heterojunction structure;
7. Second dielectric layer/passivation layer $SiN_x$;
8. Third dielectric layer/lower surface mask layer $SiN_x$;
9. Second P-type GaN layer;

10. N+-GaN layer;
11. Source metal layer;
12. Drain metal layer;
13. Isolation layer/passivation protective layer $SiO_2$;
14. Gate dielectric layer $Al_2O_3$;
15. Gate metal layer;
101. Gate region window/current aperture;
102. Etched groove; and
103. Source region window.

DETAILED DESCRIPTION

The present disclosure provides a GaN-based superjunction vertical power transistor and a manufacturing method thereof, which realize expansion of a superjunction space charge region and increase a region where the device is subjected to a high electric field by providing a superjunction composite structure, thereby effectively mitigating the peak breakdown electric field of the device and increasing the breakdown voltage of the device, while the thin barrier Al(In, Ga)N/GaN heterostructure is used to realize an etch-free enhanced gate structure, promoting an application of the GaN-based vertical structure power transistor with high voltage and high power.

In order to make the object, technical solution and advantage of the present disclosure more apparent, the present disclosure will be further described in detail below with reference to specific embodiments thereof and the accompanying drawings. Among them, N-type lightly doped gallium nitride is expressed as "N−-GaN", and N-type heavily doped gallium nitride is expressed as "N+-GaN".

In a first exemplary embodiment of the present disclosure, a GaN-based superjunction vertical power transistor is provided.

Figure 19:
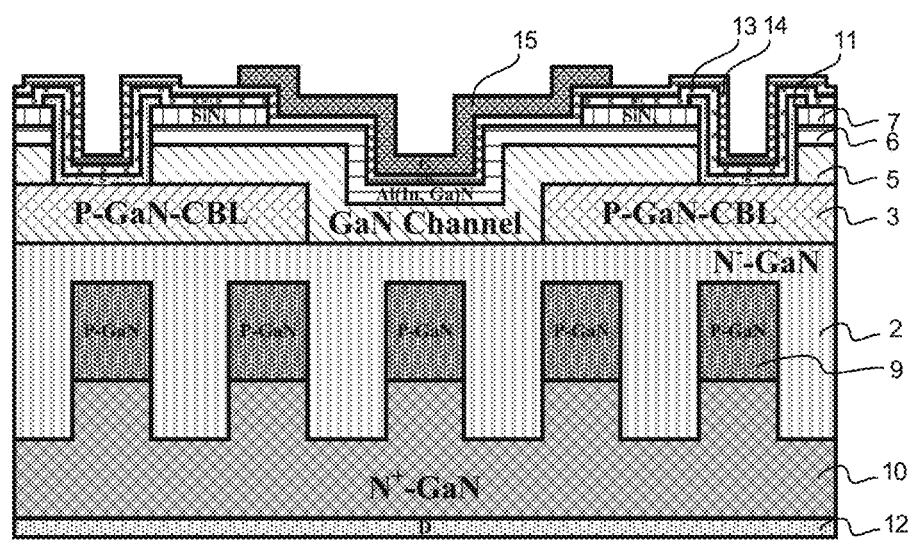

FIG. 19 is a structural schematic diagram of a GaN-based superjunction vertical power transistor obtained after growing a gate metal layer on a gate dielectric layer.

The GaN-based superjunction vertical power transistor of the present embodiment will be described in detail below with reference to the accompanying drawings.

Referring to FIG. 19, a GaN-based superjunction vertical power transistor of the present disclosure includes: an N−-GaN layer 2; a P-GaN layer 3 as a current blocking layer (P-GaN-CBL) formed on the N−-GaN layer 2 and having a gate region window therein; and a thin barrier Al(In, Ga)N/GaN heterostructure conformally formed on the current blocking layer and filling a bottom and sidewalls of the gate region window, wherein the N−-GaN layer 2 has an etched groove 102 therein, the etched groove 102 is completely or partially filled with a second P-type GaN layer 9, an N+-GaN layer 10 is formed under the second P-type GaN layer 9, and the N+-GaN layer 10 is in direct contact with the second P-type GaN layer 9 and the N−-GaN layer 2 to form a superjunction composite structure.

A GaN layer 5 in the thin barrier Al(In, Ga)N/GaN heterostructure is mainly used as a channel layer, and an Al(In, Ga)N layer 6 in the thin barrier Al(In, Ga)N/GaN heterostructure is mainly used as a barrier layer. The heterojunction structure of the two layers realizes an etch-free enhanced gate structure.

In some embodiments of the present disclosure, referring to FIG. 19, the GaN-based superjunction vertical power transistor further includes a source, a drain, and a gate. The gate is formed on a portion of the thin barrier Al(In, Ga)N/GaN heterostructure filling the gate region window. The gate includes a gate dielectric layer 14 and a gate metal layer 15. A source region window is also formed in the thin barrier Al(In, Ga)N/GaN heterostructure for forming the source. The bottom and sidewalls of the source region window are filled with a source metal layer 11. A drain metal layer 12 is also formed under the N+-GaN layer 10.

In this embodiment, the etched groove 102 has a depth between a surface of the N−-GaN layer and an interface between the N−-GaN layer and the P-GaN layer, or is etched to the interface between the N−-GaN layer 2 and the P-GaN layer 3.

In some embodiments of the present disclosure, as shown in FIG. 19, the source metal layer 11 is covered with an insulating material, wherein the insulating material is a composite layer structure, and the composite layer structure includes an isolation layer 13 and the gate dielectric layer 14. A passivation layer 7 is provided between the isolation layer 13 and the thin barrier Al(In, Ga)N/GaN heterostructure in a region between the gate and the source, wherein the passivation layer located on the thin barrier Al(In, Ga)N/GaN heterostructure is mainly used as a recovery layer of two-dimensional electron gas between the gate and the source, and the two-dimensional electron gas is recovered through passivation of the passivation layer or entire passivation of the passivation layer and the isolation layer. The isolation layer 13 on the passivation layer 7 is mainly used as a passivation protective layer for high energy ion implantation in the subsequent isolation process of the device, and is therefore also referred to as an isolation layer.

In some embodiments of the present disclosure, two-dimensional electron gas between a gate and a source in a thin barrier Al(In, Ga)N/GaN heterostructure is recovered through passivation of a passivation layer between the gate and the source. The passivation layer includes one or more of the following materials: polarized AlN, $SiN_x$ SiON.

In some embodiments of the present disclosure, the Al(In, Ga)N barrier layer in the thin barrier Al(In, Ga)N/GaN heterostructure includes, but is not limited to, one or more of the following materials: a ternary alloy including AlGaN, AlInN or InGaN etc.; or a quaternary alloy including AlInGaN etc. The Al(In, Ga)N barrier layer has a thickness between 0.5 nm and 5 nm.

The N−-GaN layer 2 has an etched groove 102 in which a second P-type GaN layer 9 is completely or partially filled. In some embodiments of the present disclosure, the second P-type GaN layer 9 has a concentration ranging from $10^{16}$ $cm^{-3}$ to $10^{20}$ $cm^{-3}$.

An N+-GaN layer 10 is formed under the second P-type GaN layer 9, and the N+-GaN layer 10 is in direct contact with the second P-type GaN layer 9 and the N−-GaN layer 2 to form a superjunction composite structure.

By providing the superjunction composite structure, the expansion of a superjunction space charge region is realized, a region where the device is subjected to a high electric field is increased, and the peak breakdown electric field of the device is effectively mitigated, thereby increasing the breakdown voltage of the device, while the thin barrier Al(In, Ga)N/GaN heterostructure is used to realize an etch-free enhanced gate structure, promoting an application of the GaN-based vertical structure power transistor with high voltage and high power.

In a second exemplary embodiment of the present disclosure, a method for manufacturing a GaN-based superjunction vertical power transistor is provided, and any fabrication process for forming a corresponding device structure and corresponding positional relationship is within the protection scope of the present disclosure. The order of the preparation processes can also be adjusted adaptively. An example of a manufacturing method of the device shown in the first embodiment will be given below.

FIGS. 1-19 are schematic diagrams of a manufacturing process of a GaN-based superjunction vertical power transistor, in accordance with some embodiments of the present disclosure.

Referring to FIGS. 1 to 19, a method for manufacturing a GaN-based superjunction vertical power transistor of the present embodiment includes:

Step S21: epitaxially growing an N⁻-GaN layer 2 on a substrate 1;

The substrate includes, but is not limited to, one or more of the following planar substrates: a Si substrate, a SiC substrate, a sapphire substrate, or a GaN bulk material substrate (hereinafter referred to as a gallium nitride substrate).

Figure 1:
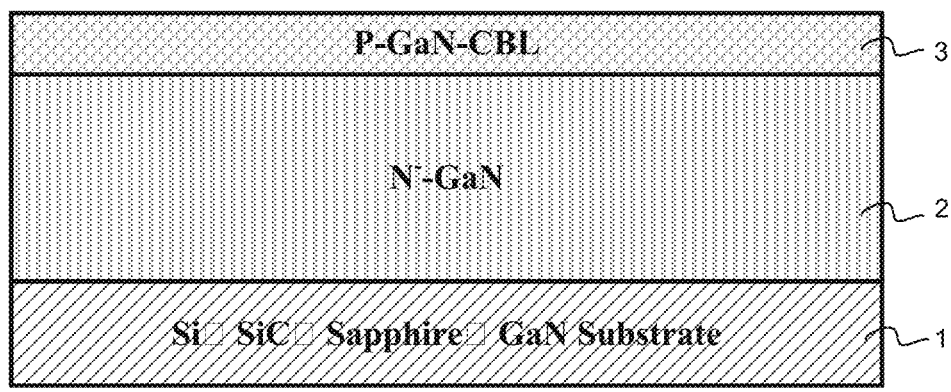
FIGS. 1-19 are schematic diagrams of a manufacturing process of a GaN-based superjunction vertical power transistor in accordance with some embodiments of the present disclosure.

Step S22: epitaxially growing a P-GaN layer 3 on the N⁻-GaN layer 2, as a current blocking layer;

FIG. 1 is a structural schematic diagram of forming an N⁻-GaN layer and a P-type GaN epitaxial layer on a substrate.

The N⁻-GaN layer 2 and the P-type GaN epitaxial layer epitaxially grown on the substrate 1 are shown in FIG. 1.

Methods of epitaxial growth include, but not limited to, epitaxial growth methods such as metal organic compound chemical vapor deposition (MOCVD) or molecular beam epitaxy (MBE).

The process of forming p-GaN by using epitaxially grown p-GaN instead of a conventional injection method avoids the problem of injection activation.

Figure 2:
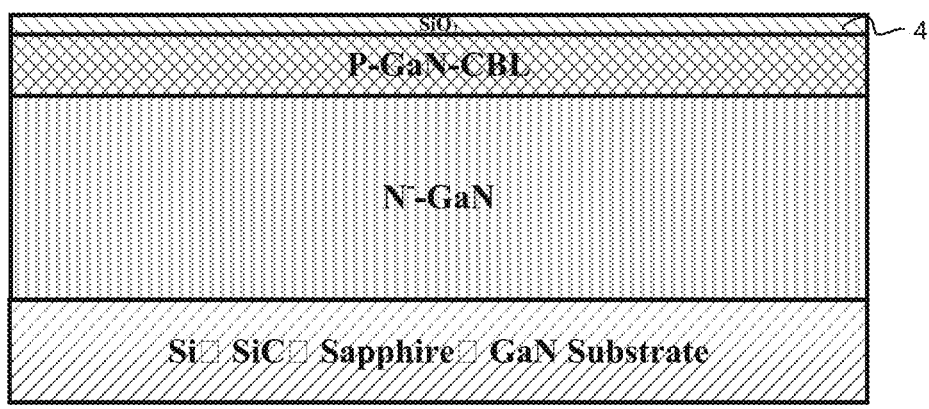
Figure 3:
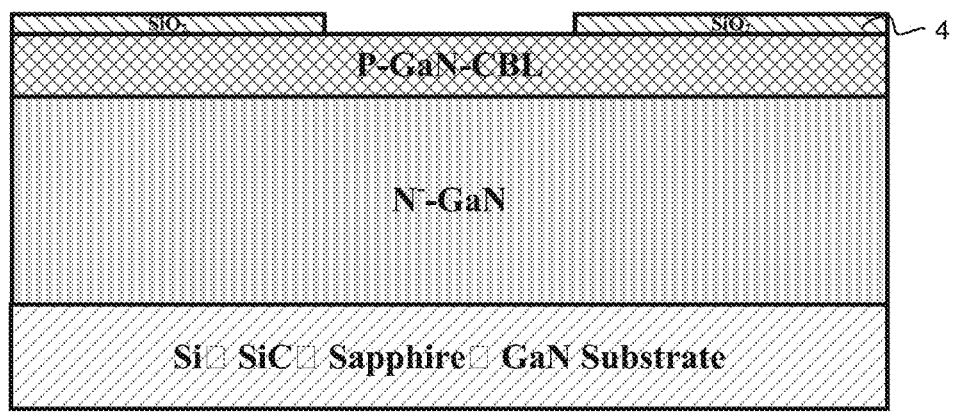
Figure 4:
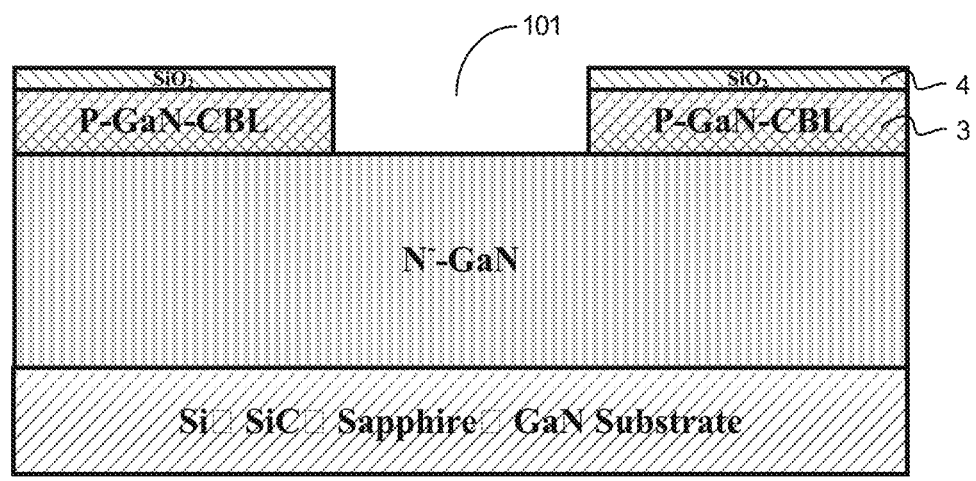
Figure 5:
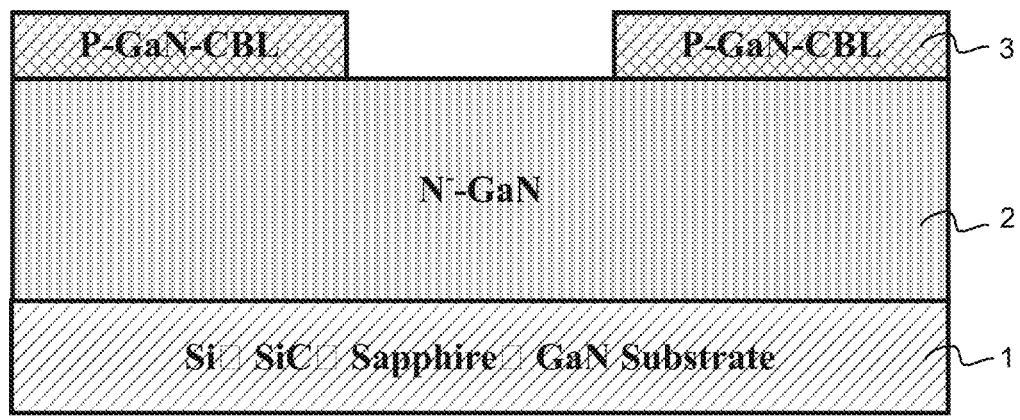

Step S23: forming a gate region window 101 in the current blocking layer 3 by a gate trench etching technique;

FIGS. 2-5 illustrate a process of manufacturing a gate region window 101 in a current blocking layer. FIG. 2 is a structural schematic diagram of forming a mask layer on P-type GaN. FIG. 3 is a structural schematic diagram of forming a gate region opening by patterning an upper surface mask layer. FIG. 4 is a structural schematic diagram of forming a gate region window by etching the current blocking layer based on the gate region opening in FIG. 3. FIG. 5 is a structural schematic diagram of removing the upper surface mask layer.

Step S23 includes: depositing a first dielectric layer 4 on the P-type GaN layer 3 to form a mask layer, as shown in FIG. 2; forming a gate region opening by patterning on the mask layer 4, as shown in FIG. 3; forming a gate region window 101 by etching the current blocking layer 3 based on the gate region opening, as shown in FIG. 4; and removing the upper surface mask layer, to obtain the structure as shown in FIG. 5.

In this embodiment, the first dielectric layer 4 is used as the upper surface mask layer 4, and is represented by $SiO_2$ material, and the material of the first dielectric layer 4 may be $SiN_x$ or SiON, etc. One or more of MOCVD, low pressure chemical vapor deposition (LPCVD), plasma enhanced chemical vapor deposition (PECVD), inductively coupled plasma chemical vapor deposition (ICPCVD) or atomic layer deposition (ALD) may be used for preparation. For example, the mask layer may be made of $SiO_2$ prepared by PECVD.

Figure 6:
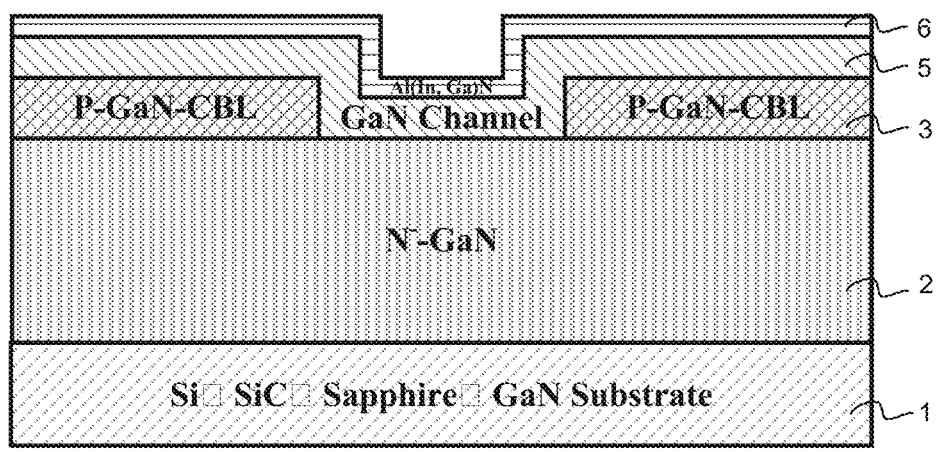

Step S24: conformally growing a thin barrier Al(In, Ga)N/GaN heterostructure on the current blocking layer 3, the heterostructure comprising a GaN layer 5 and a Al(In, Ga)N layer 6 thereon, and the heterostructure filling the bottom and sidewalls of the gate region window;

FIG. 6 is a structural schematic diagram of a conformal growth of a thin barrier Al(In, Ga)N/GaN heterostructure on the current blocking layer.

A thin barrier Al(In, Ga)N/GaN heterostructure is conformally grown on the current blocking layer 3, as shown in FIG. 6, and the heterostructure fills the bottom and sidewalls of the gate region window.

Step S25: forming an etched groove in the N⁻-GaN layer 2;

In some embodiments of the present disclosure, Step S25 includes: depositing a second dielectric layer 7 on an upper surface of the thin barrier Al(In, Ga)N/GaN heterostructure, as a passivation layer; depositing a third dielectric layer 8 on a lower surface of the N⁻-GaN layer 2 or the GaN substrate; and forming an etched groove by performing selective etching in the N⁻-GaN layer 2 using the third dielectric layer 8 as a mask layer.

In some embodiments, the second dielectric layer and the third dielectric layer are prepared by LPCVD or PECVD, and the materials of the second dielectric layer and the third dielectric layer include one or more of the following materials: $SiO_2$, polarized AlN, $SiN_x$ or SiON. In some embodiments, the second dielectric layer and the third dielectric layer have a thickness between 10 nm and 120 nm. In Step S25, the second dielectric layer 7 mainly serves as a passivation layer to protect the upper surface; and the processing of the lower surface is focused, and the third dielectric layer 8 serves as a hard mask for performing selective etching to form an etched groove. In a subsequent process, the third dielectric layer 8 is finally removed, while the second dielectric layer 7 remains between the gate and the source. Two-dimensional electron gas between the gate and the source in the thin barrier Al(In, Ga)N/GaN heterostructure is recovered by passivation of the passivation layer between the gate and the source, and the material of the passivation layer includes one or more of the following materials: $SiO_2$, polarized AlN, $SiN_x$ or SiON.

When the substrate is a gallium nitride substrate, in the process of manufacturing the etching groove, it is not necessary to completely remove the substrate before the step of depositing the third dielectric layer on the lower surface of the substrate (substrate thinning may be performed according to process requirements). When the substrate is a Si substrate, a SiC substrate, or a sapphire substrate or the like, it is necessary to completely remove the substrate such that the N⁻-GaN layer is exposed to the surface.

Figure 7:
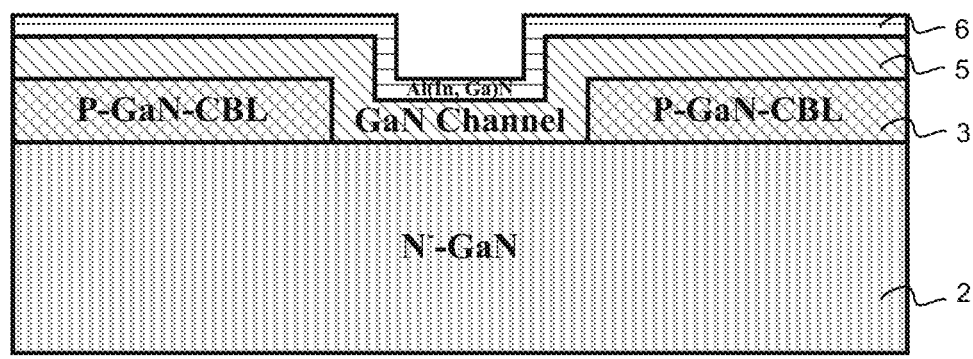
Figure 8:
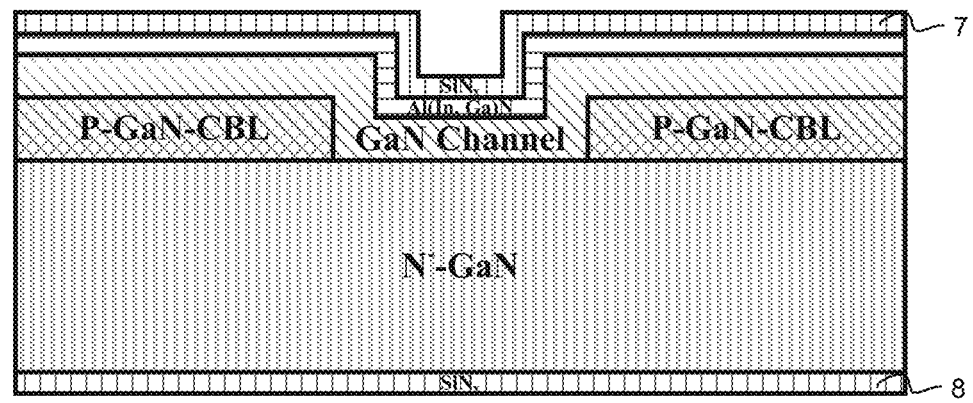
Figure 9:
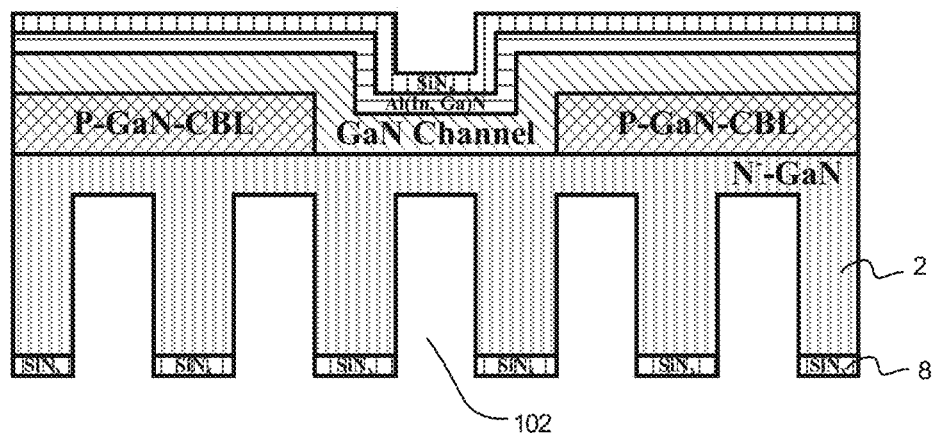

The following is exemplified in the case where the substrate is not a gallium nitride substrate. FIG. 7 is a structural schematic diagram of removing the substrate such that the N⁻-GaN layer is exposed to the surface when the substrate is a non-GaN substrate. FIG. 8 is a structural schematic diagram of depositing a second dielectric layer as a passivation layer on an upper surface of the thin barrier Al(In, Ga)N/GaN heterostructure and depositing a third dielectric layer as a mask layer on a lower surface of the N⁻-GaN layer. FIG. 9 is a structural schematic diagram of forming an etched groove by performing selective etching in the N⁻-GaN layer by using the third dielectric layer as a mask layer. As shown in FIG. 7, the substrate is removed in the structure obtained in Step S24. The method of removing the substrate includes etching or substrate peeling techniques or the like. Then a second dielectric layer 7 is deposited on the upper surface of the thin barrier Al(In, Ga)N/GaN heterostructure, as a passivation layer, and a third dielectric layer 8 is deposited on the lower surface of the N⁻-GaN layer 2 or a GaN substrate, as shown in FIG. 8. By using the third dielectric layer 8 as a mask layer, an etched groove is formed by performing selective etching in the N⁻-GaN layer 2, and the structure after the selective etching is as shown in FIG. 9. Of course, the distribution of etched grooves in the N⁻-GaN layer, including distribution pitches, etched widths and depths or the like, may be adaptively set according to actual needs. In this embodiment, for example, etched grooves are uniformly distributed, and sizes of respective etched grooves are the same. In other embodiments, the distribution pattern and the etched sizes may be non-uniform.

In this embodiment, the etched groove 102 has a depth between the surface of the N⁻-GaN layer and the interface between the N⁻-GaN layer and the P-GaN layer. In some embodiments, the etched depth may be etched to the interface between the N⁻-GaN layer 2 and the P-GaN layer 3.

Figure 10:
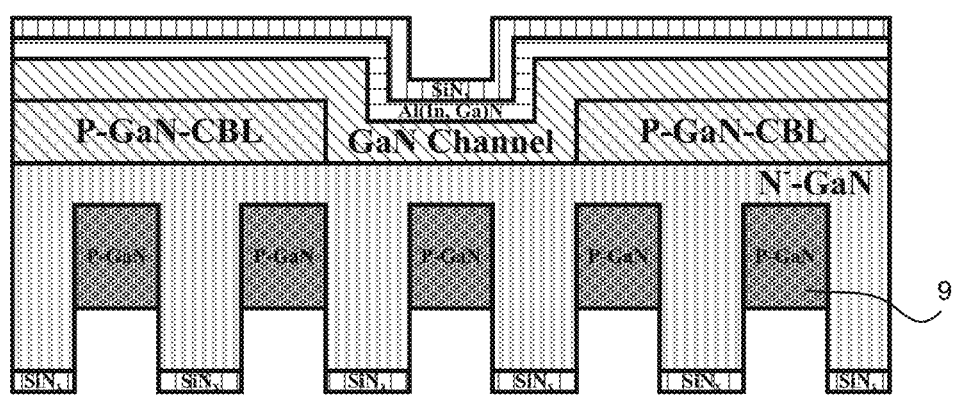

Step S26: completely or partially filling a second P-type GaN layer 9 in the etched groove;

FIG. 10 is a structural schematic diagram of completely or partially filling a second P-type GaN layer in the etched groove.

In this embodiment, the etched groove 102 is completely or partially filled with a second P-type GaN layer 9, which is schematically illustrated as partial filling in FIG. 10.

In some embodiments of the present disclosure, the concentration of the second P-type GaN layer 9 ranges from $10^{16}$ cm⁻³ to $10^{20}$ cm⁻³.

Figure 11:
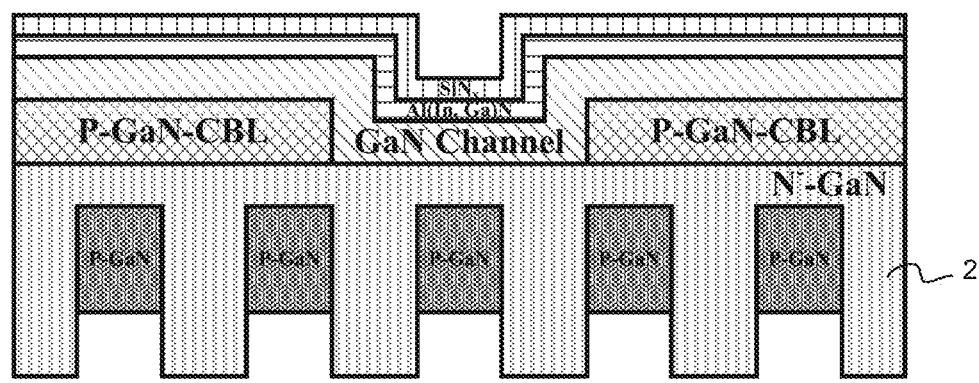

FIG. 11 is a structural schematic diagram of removing the mask layer under the N⁻-GaN layer. After Step S26, the method further includes a step of removing the mask layer under the N⁻-GaN layer, as shown in FIG. 11.

Figure 12:
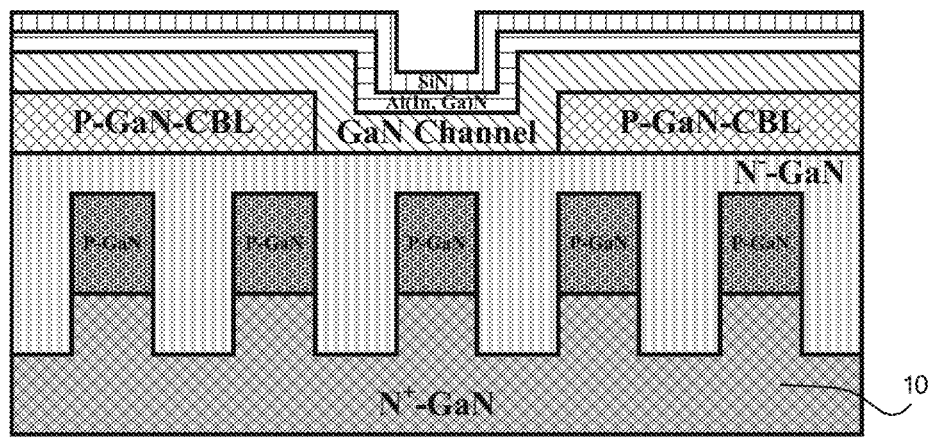

Step S27: forming an N⁺-GaN layer 10 under the second P-type GaN layer 9;

FIG. 12 is a structural schematic diagram of manufacturing an N⁺-GaN layer under the second P-type GaN layer. Referring to FIG. 12, an N⁺-GaN layer 10 is formed under the second P-type GaN layer 9, and the N⁺-GaN layer 10 is in direct contact with the second P-type GaN layer 9 and the N⁻-GaN layer 2 to form a superjunction composite structure.

Figure 13:
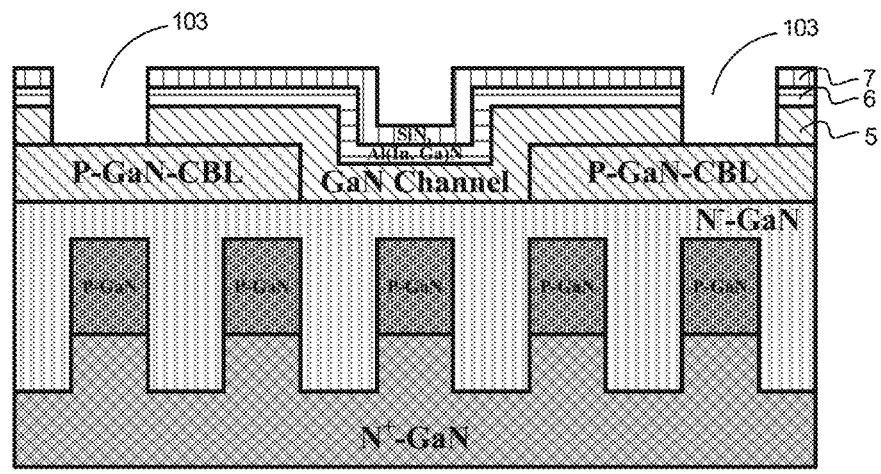

Step S28: manufacturing a source, a drain, and a gate to form a GaN-based superjunction vertical power transistor;

Step S28 includes the following sub-steps:

S28a: etching the second dielectric layer and the thin barrier Al(In, Ga)N/GaN heterostructure of the source region to the P-GaN layer by a gate trench etching technique to obtain a source region window 103;

FIG. 13 is a structural schematic diagram of manufacturing a source region window by a gate trench etching technique. Referring to FIG. 13, the second dielectric layer and the thin barrier Al(In, Ga)N/GaN heterostructure of the source region are etched to the P-GaN layer by the gate trench etching technique, to obtain source region windows 103 on both sides of the gate.

Figure 14:
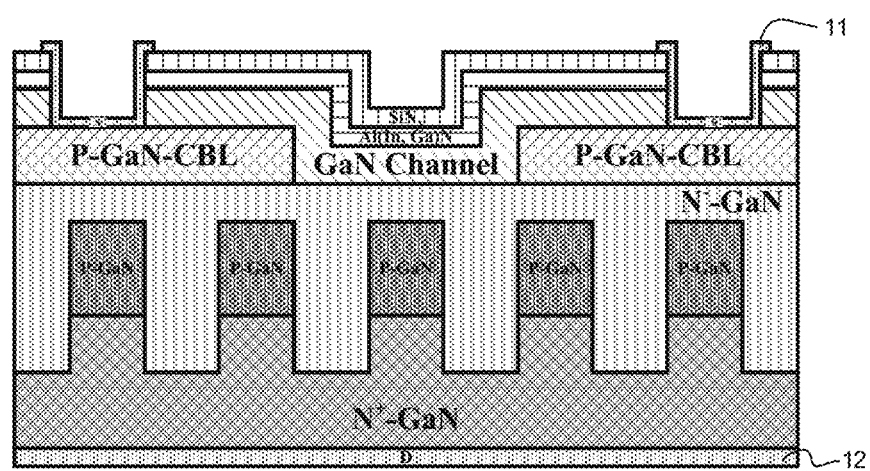

S28b: depositing a source metal layer 11 on the sidewalls and the bottom of the source region window 103; and depositing a drain metal layer 12 under the N⁺-GaN layer 10;

FIG. 14 is a structural schematic diagram of depositing a source metal layer on the sidewalls and the bottom of the source region window and depositing a drain metal layer under the N⁺-GaN layer.

A source metal layer 11 is deposited on the sidewalls and the bottom of the source region window 103, and the source metal layer 11 covers at least a portion of the upper surface of the second dielectric layer 7, as shown in FIG. 14.

Figure 15:
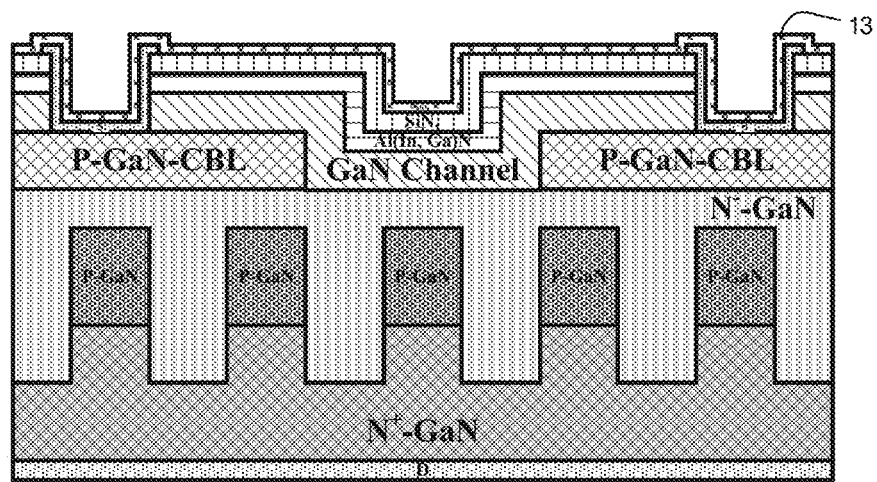

S28c: growing a passivation protective layer 13 on the source metal layer 11 and the second dielectric layer 7, as an isolation layer 13 for device isolation;

FIG. 15 is a structural schematic diagram of growing a passivation protective layer on the source metal layer and the second dielectric layer, as an isolation layer for device isolation. Referring to FIG. 15, a passivation protective layer 13 is grown on the source metal layer 11 and the second dielectric layer 7, and the passivation protective layer covers the upper surface of the device, as an isolation layer 13 for device isolation.

Figure 16:
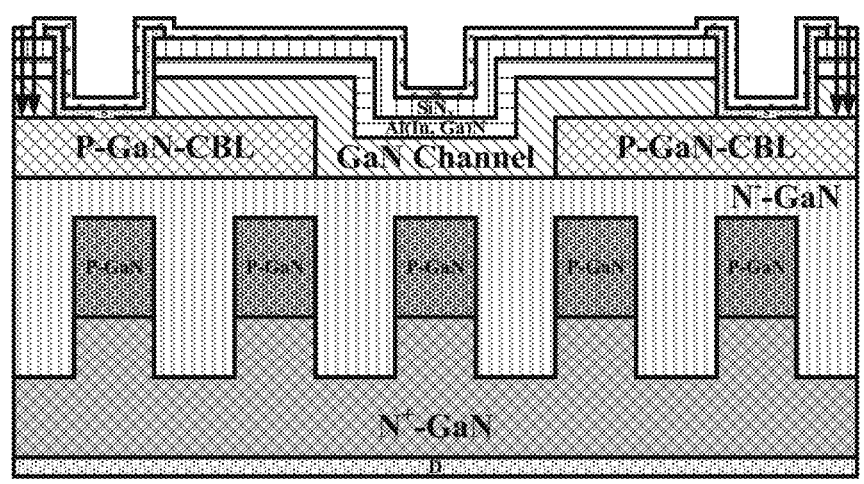

S28d: performing isolation using high energy ion injection in an active region of the device;

FIG. 16 is a schematic diagram of performing isolation using high energy ion injection in an active region of the device. Referring to FIG. 16, high-energy ions such as N, B, and F are injected at edges of the source of the device to isolate the active region.

Figure 17:
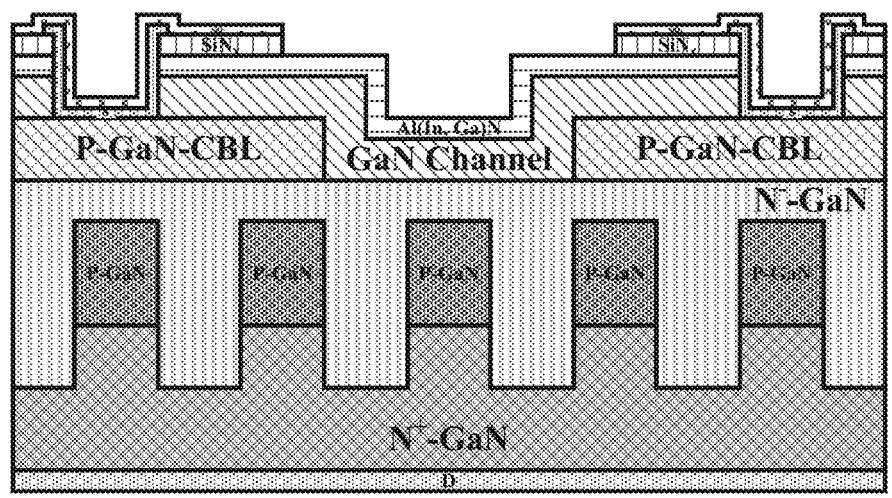

S28e: etching the isolation layer 13 and the second dielectric layer 7 of the gate region to the upper surface of the thin barrier layer Al(In, Ga)N by the gate trench etching technique;

FIG. 17 is a structural schematic diagram of etching the isolation layer and the second dielectric layer of the gate region to an upper surface of the thin barrier layer Al(In, Ga)N by a gate trench etching technique. Referring to FIG. 17, the isolation layer 13 and the second dielectric layer 7 of the gate region are etched to the upper surface of the thin barrier layer Al(In, Ga)N by the gate trench etching technique, so that the thin barrier layer Al (In, Ga)N is exposed.

Figure 18:
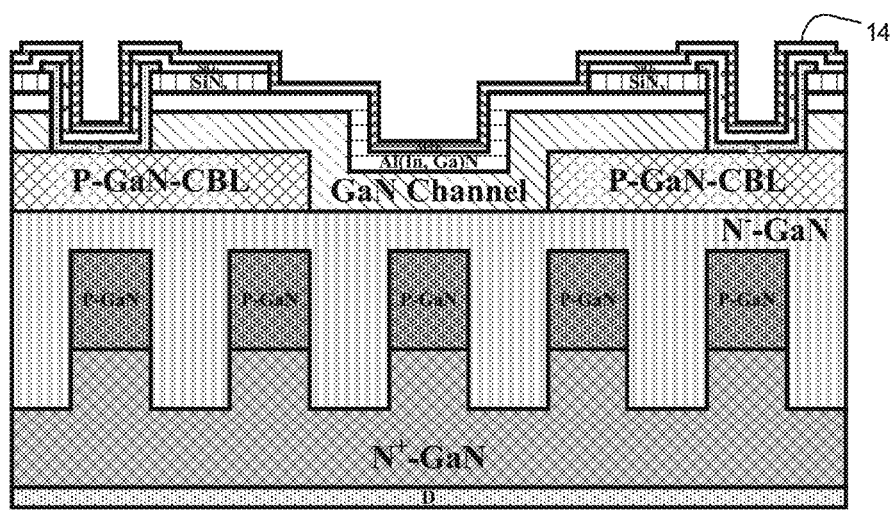

S28f: conformally growing a gate dielectric layer 14 on the upper surface of the thin barrier layer Al(In, Ga)N and the upper surface of the isolation layer 13;

FIG. 18 is a structural schematic diagram of a conformal growth of a gate dielectric layer on an upper surface of the thin barrier layer Al(In, Ga)N and an upper surface of the isolation layer. Referring to FIG. 18, a gate dielectric layer is conformally grown on the upper surface of the thin barrier layer Al(In, Ga)N and the upper surface of the isolation layer, and the gate dielectric layer covers the upper surface of the device.

S28g: growing a gate metal layer 15 on the gate dielectric layer 14;

FIG. 19 is a structural schematic diagram of a GaN-based superjunction vertical power transistor obtained after growing a gate metal layer on the gate dielectric layer. A gate metal layer 15 is grown on the gate dielectric layer 14 to obtain a GaN-based superjunction vertical power transistor, and thus the fabrication of the device is completed, as shown in FIG. 19.

As discussed above, the present disclosure provides a GaN-based superjunction vertical power transistor and a manufacturing method thereof. which realize expansion of a superjunction space charge region and increase a region where the device is subjected to a high electric field by providing a superjunction composite structure, thereby effectively mitigating the peak breakdown electric field of the device and increasing the breakdown voltage of the device, while the thin barrier Al(In, Ga)N/GaN heterostructure is used to realize an etch-free enhanced gate structure, promoting an application of the GaN-based vertical structure power transistor with high voltage and high power. The process of forming p-GaN by using epitaxially grown p-GaN instead of a conventional injection method avoids the problem of injection activation. A thin barrier Al(In, Ga)N/GaN heterostructure is used to form an enhanced device, and the two-dimensional electron gas (2DEG) between the gate and the source is recovered by a passivation layer of $SiO_2$, polarized AlN, SiN$_x$ or SiON avoiding gate trench etching and problems such as etched thickness control in a gate trench etching technique.

It should be noted that in the drawings or the description of the specification, the same reference numerals are used for similar or same parts. Implementations not shown or described in the figures are in the form known to those of ordinary skill in the art. Additionally, although an example of a parameter containing a particular value may be provided herein, it should be understood that the parameter need not be exactly equal to the corresponding value, but rather may approximate the corresponding value within an acceptable error tolerance or design constraint. The directional terms mentioned in the embodiments, such as "upper", "lower", "front", "back", "left", "right", etc., only refer to the directions in the drawings. Therefore, the used directional terms are intended to be illustrative rather than for the purpose of limiting the scope of the disclosure.

Also, some conventional structures and components may be illustrated in a simplified schematic form for the purpose of simplification of the drawings. In addition, some of the features in the drawings of the present invention may be slightly enlarged or changed in proportion or size for the purpose of facilitating understanding and viewing of the technical features of the present disclosure, but this is not intended to limit the present disclosure. The actual size and specifications of the products manufactured in accordance with the teachings of the present disclosure should be adjusted according to the production requirements, the characteristics of the products themselves, and the contents disclosed in the following disclosure.

The use of ordinal numbers such as "first", "second", "third" or the like, as used in the description and claims to modify corresponding elements, does not mean that the element has any ordinal number, and does not represent the order of the element and another element or the order of the manufacturing method. They are used only to clearly distinguish a component having a certain name from another component having the same name.

Further, the word "including or comprising" or "includes or comprises" does not exclude the presence of the elements or the steps that are not listed in the claims. The word "a" or "an" before the element does not exclude the presence of a plurality of such elements.

In addition, the order of the above steps is not limited to the above example, and may be varied or rearranged depending on the desired design, unless specifically described or necessarily occurring in a sequence. The above embodiments may be used in combination with each other or mixed with other embodiments based on design and reliability considerations, that is, the technical features in different embodiments may be freely combined to form more embodiments.

The object, technical solution and beneficial effect of the present disclosure have been described in detail with reference to the above specific embodiments of the present disclosure. It should be understood that the above examples are only specific embodiments of the present disclosure and not for limiting the present disclosure. Any modifications, equivalent substitutions, improvements, etc., made within the spirit and principle of the present disclosure is intended to be included within the scope of the present disclosure.

We claim:

1. A GaN-based superjunction vertical power transistor, comprising:
    an N$^-$-GaN layer;
    a first P-GaN layer, as a current blocking layer, formed on the N$^-$-GaN layer, and having a gate region window; and
    a thin barrier Al(In, Ga)N/GaN heterostructure, conformally formed on the current blocking layer and filling a bottom of the gate region window as well as one or more sidewalls of the gate region window,
    wherein the N$^-$-GaN layer has an etched groove completely or partially filled with a second P-type GaN layer, wherein an N$^+$-GaN layer is formed under the second P-type GaN layer, and wherein the N$^+$-GaN layer is in direct contact with the second P-type GaN layer and the N$^-$-GaN layer to form a superjunction composite structure.

2. The GaN-based superjunction vertical power transistor according to claim 1, further comprising: a source, a drain, and a gate.

3. The GaN-based superjunction vertical power transistor according to claim 2, wherein:
    the gate is formed on a portion of the thin barrier Al(In, Ga)N/GaN heterostructure filling the gate region window, the gate including a gate dielectric layer and a gate metal layer;
    a source region window is further formed in the thin barrier Al(In, Ga)N/GaN heterostructure for the source, and a bottom of the source region window as well as one or more sidewalls of the source region window are filled with a source metal layer; and
    a drain metal layer is further formed under the N$^+$-GaN layer.

4. The GaN-based superjunction vertical power transistor according to claim 3, wherein the source metal layer is covered with an insulating material, the insulating material has a composite layer structure comprising an isolation layer and the gate dielectric layer, and a passivation layer is provided between the isolation layer and the thin barrier Al(In, Ga)N/GaN heterostructure in a region between the gate and the source.

5. The GaN-based superjunction vertical power transistor according to claim 3, wherein two-dimensional electron gas between the gate and the source in the thin barrier Al(In, Ga)N/GaN heterostructure is recovered by passivation of a passivation layer between the gate and the source, or entire passivation of the passivation layer and an isolation layer, and the material of the passivation layer comprises one or more selected from: SiN$_x$, SiON, SiO$_2$ or polarized AlN.

6. The GaN-based superjunction vertical power transistor according to claim 3, wherein the gate dielectric layer comprises one or more selected from: Al$_2$O$_3$, SiO$_2$, SiN$_x$, or SiON.

7. The GaN-based superjunction vertical power transistor according to claim 1, wherein an Al(In, Ga)N barrier layer in the thin barrier Al(In, Ga)N/GaN heterostructure comprises one or more selected from: a ternary alloy comprising AlGaN or AlInN; or a quaternary alloy comprising AlInGaN.

8. The GaN-based superjunction vertical power transistor according to claim 7, wherein the Al(In, Ga)N barrier layer has a thickness between 0.5 nm and 5 nm.

9. The GaN-based superjunction vertical power transistor according to claim 1, wherein the second P-type GaN layer has a concentration ranging from $10^{16}$ cm$^{-3}$ to $10^{20}$ cm$^{-3}$.

10. A manufacturing method of a GaN-based superjunction vertical power transistor, the method comprising:
    epitaxially growing an N$^-$-GaN layer on a substrate;
    epitaxially growing a first P-GaN layer on the N$^-$-GaN layer, as a current blocking layer;

forming a gate region window in the current blocking layer by a gate trench etching technique;

conformally growing a thin barrier Al(In, Ga)N/GaN heterostructure on the current blocking layer, the heterostructure filling a bottom of the gate region window as well as one or more sidewalls of the gate region window;

forming an etched groove in the $N^-$-GaN layer;

completely or partially filling the etched groove with a second P-type GaN layer; and forming an $N^+$-GaN layer under the second P-type GaN layer, the $N^+$-GaN layer being in direct contact with the second P-type GaN layer and the $N^-$-GaN layer to form a superjunction composite structure.

11. The manufacturing method according to claim 10, wherein:

the forming the etched groove comprises:

depositing a first dielectric layer on an upper surface of the thin barrier Al(In, Ga)N/GaN heterostructure, as a passivation layer, and depositing a second dielectric layer on a lower surface of the $N^-$-GaN layer or the substrate when the substrate comprises GaN; and forming an etched groove by performing selective etching in the $N^-$-GaN layer by using the second dielectric layer as a mask layer; and the manufacturing method further comprises forming a source, a drain, and a gate, and forming the source, the drain, and the gate comprises:

etching the first dielectric layer and the thin barrier Al(In, Ga)N/GaN heterostructure of the source region to the first P-GaN layer by a gate trench etching technique to obtain a source region window;

depositing a source metal layer on a bottom of the source region window as well as one or more sidewalls of the source region window;

depositing a drain metal layer under the $N^+$-GaN layer;

growing a passivation protective layer on the source metal layer and the first dielectric layer, as an isolation layer for device isolation;

performing isolation using high energy ion injection in an active region of the device;

etching the isolation layer and the first dielectric layer of the gate region to an upper surface of a thin barrier layer Al(In, Ga)N by a gate trench etching technique;

conformally growing a gate dielectric layer on the upper surface of the thin barrier layer Al(In, Ga)N and the upper surface of the isolation layer; and growing a gate metal layer on the gate dielectric layer.

12. The manufacturing method according to claim 11, wherein the substrate is one or more selected from: a Si substrate, a SiC substrate, a sapphire substrate, or a GaN bulk material substrate.

13. The manufacturing method according to claim 11, wherein the first dielectric layer and the second dielectric layer are formed by LPCVD or PECVD, and the first dielectric layer and the second dielectric layer comprise one or more selected from: $SiO_2$, polarized AlN, $SiN_x$, or SiON.

14. The manufacturing method according to claim 10, wherein the first dielectric layer and the second dielectric layer have a thickness between 10 nm and 120 nm.

15. The manufacturing method according to claim 10, wherein the etched groove has a depth between a surface of the $N^-$-GaN layer and an interface between the $N^-$-GaN layer and the first P-GaN layer, or is etched to the interface between the $N^-$-GaN layer and the first P-GaN layer.

16. The manufacturing method according to claim 11, wherein the gate dielectric layer comprises one or more selected from: $Al_2O_3$, $SiO_2$, $SiN_x$, or SiON.

17. The GaN-based superjunction vertical power transistor according to claim 1, wherein the etched groove has a depth between a surface of the $N^-$-GaN layer and an interface between the $N^-$-GaN layer and the first P-GaN layer, or is etched to the interface between the $N^-$-GaN layer and the first P-GaN layer.

* * * * *